United States Patent [19]

Barnes et al.

[11] 4,313,262
[45] Feb. 2, 1982

[54] MOLYBDENUM SUBSTRATE THICK FILM CIRCUIT

[75] Inventors: Norman S. Barnes, Whitesboro; Rodman A. Mogle, Clinton, both of N.Y.

[73] Assignee: General Electric Company, Utica, N.Y.

[21] Appl. No.: 103,984

[22] Filed: Dec. 17, 1979

[51] Int. Cl.³ .............................................. H05K 3/34
[52] U.S. Cl. ...................................... 29/840; 29/831; 29/846; 156/89
[58] Field of Search ................. 29/840, 846, 850, 831; 264/61; 156/89; 174/68.5

[56] References Cited

U.S. PATENT DOCUMENTS

| | | |
|---|---|---|
| 3,531,579 | 9/1970 | Katz . |
| 3,689,684 | 9/1972 | Cox et al. . |
| 3,770,529 | 11/1973 | Anderson ........................ 156/89 X |
| 3,798,762 | 3/1974 | Harris et al. . |
| 3,838,204 | 9/1974 | Ahn et al. . |
| 3,852,877 | 12/1974 | Ahn et al. ........................ 156/89 X |
| 3,912,849 | 10/1975 | Thomas . |
| 3,922,777 | 12/1975 | Weitze et al. . |
| 3,999,004 | 12/1976 | Chirino et al. ..................... 427/96 X |
| 4,107,837 | 8/1978 | Chang . |
| 4,109,377 | 8/1978 | Blazick et al. ..................... 264/61 X |
| 4,130,855 | 12/1978 | Smolko et al. . |

FOREIGN PATENT DOCUMENTS

| | | | |
|---|---|---|---|
| 776970 | 6/1957 | United Kingdom .................. 156/89 |
| 1441526 | 7/1976 | United Kingdom ............... 174/68.5 |

OTHER PUBLICATIONS

D. Chance et al., IBM Tech. Discl. Bull., vol. 10, No. 11, Apr. 1968, pp. 1663-1664.

J. Gniewek et al., IBM Tech. Discl. Bul., vol. 18, No. 9, Feb. 1976, pp. 2856-2857.

Primary Examiner—Gene P. Crosby
Assistant Examiner—C. J. Arbes
Attorney, Agent, or Firm—Ralph M. Savage

[57] ABSTRACT

An improved multilayered circuit is disclosed comprising a molybdenum substrate with alternating layers of dielectric and conducting thick film materials deposited thereon. The molybdenum substrate has the advantages of being its own chassis, having a coefficient of thermal expansion that is well matched to the thick film materials and component ceramic chip carriers, and having a high thermal conductivity so as to act as its own heat sink.

6 Claims, 2 Drawing Figures

MOLYBDENUM SUBSTRATE THICK FILM CIRCUIT

FIELD OF THE INVENTION

This invention relates to printed circuit boards for thick film circuits and particularly, to such printed circuit boards utilizing molybdenum substrates.

DESCRIPTION OF THE PRIOR ART

The industry standard is for thick film materials to be deposited upon ceramic substrates. There are at least 5 problems associated with the utilization of ceramic material as a substrate for thick film printed circuit boards. First, their size is limited to approximately 20 square inches with current state of the art fabrication techniques. Second camber control is poor making ceramic substrates greater than approximately 2" by 2" difficult to process. Since a typical camber value is 0.004 inches per inch, a five inch substrate will have a 0.020 inch camber from edge to edge. With such a camber, the substrate will be difficult to process because it will not hold tight in a vacuum chuck for thick film process printing.

Third, holes in ceramic substrates and special substrate sizes must be tooled and pre-formed by the ceramic manufacturers.

Fourth, the thermal conductivity of ceramic substrates is poor and often a separate heat sink must be utilized.

Fifth, a separate chassis is frequently required to provide adequate machined support to the brittle ceramic substrate to prevent substrate cracking in severe environments.

Another technology is the printed wiring board approach which is composed of glass reinforced organic dielectric layers and copper conductor patterns. This technology has even poorer thermal conductivity characteristics, is more limited in environmental temperature range, and has an untolerable thermal coefficient of expansion mismatch to the alumina ceramic chip carriers.

Porcelainized steel substrates have many of the same problems already mentioned. They must be preformed and precoated by their manufacturer. They cannot be formed at all by the user because their glaze coating will crack. The thick film application processes are limited to 550° C. and the substrate's coefficient of thermal expansion does not match that of the ceramic chip carriers. Ceramic chip carriers are metalized alumina carriers for silicon devices.

Accordingly, it is an object of the presnt invention to provide a low cost technique to fabricate a substrate that has good thermal conduction properties and a thermal coefficient of expansion similar to ceramic chip carriers and thick film dielectric and conductor materials.

A further object is to provide a substrate that will have a decreased thickness as compared to conventional printed circuit boards, yet still have a chassis with the required structural rigidity.

It is a further object to provide a substrate which is compatible with thick film processes comprised of copper conductors instead of gold conductors so that costs can be reduced.

An additional object is to provide a substrate that can be automatically processed without having the size constraints or camber problems associated with prior art structures.

A still further object is to provide a substrate that can be sheared, bent and capable of having holes drilled or notched easily.

BRIEF DESCRIPTION OF THE DRAWINGS

Various other objects, features and attendant advantages of the present invention will be more fully appreciated from the following detailed description when considered in connection with the accompanying drawings.

DESCRIPTION OF THE PREFERRED EMBODIMENT

Figure 1:
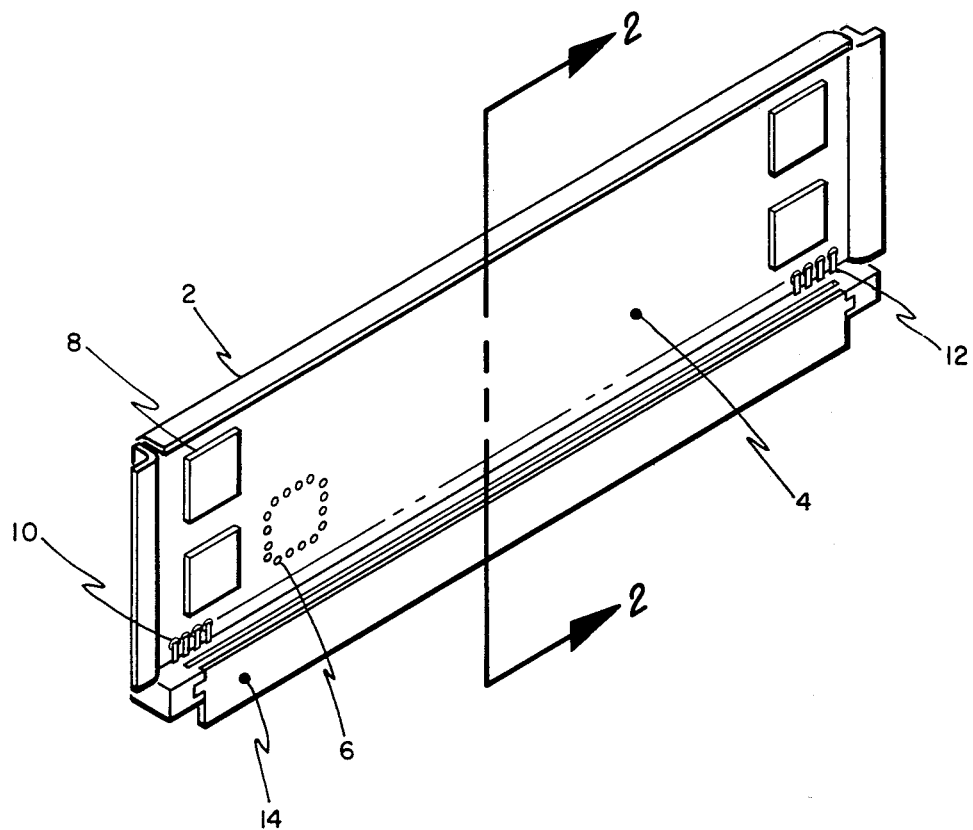
FIG. 1 is a perspective view of the molybdenum substrate formed into a typical module frame according to the present invention.

Referring now to the drawings, and more specifically to FIG. 1 thereof, there is shown generally a molybdenum substrate 2 that has been formed into a typical module frame. The sides have been bent so as to improve the structural rigidity of the substrate. Thick film layers 4 of alternating dielectric and conductor layers have been deposited on substrate 2. Pads 6 are shown which are necessary to complete the connection between the pads of chip carriers 8 and an appropriate conductor layer within thick film 4. Additional pads 10 are positioned on thick film 4 so as to make contact with connector tails 12 extending from connector 14.

The ceramic substrate of prior art devices is now unnecessary. This will save valuable space associated with thick film circuit boards so as to meet the demanding size and volume requirements of modern avionic equipment. Prior art circuit boards consist of a ceramic substrate with thickness of approximately 0.40" bonded to a metal chassis which would be normally 0.050" thick, by way of a 0.005" adhesive layer. A typical multilayered structure composed of thick film materials deposited on the ceramic structure would be 0.015" thick. Chip components mounted on the thick film layers could range from 0.060" to 0.100". This results in a prior art structure utilizing a ceramic substrate to have a thickness of from 0.170" to 0.210".

The instant invention utilizes molybdenum for the combined substrate and chassis which has a thickness of 0.025" (or 0.050" for equivalent thermal capacity). The thick film layers deposited thereon and the chip components have a thickness of 0.015" and from 0.060" to 0.100" respectively. Therefore, with the instant invention, a one sided circuitboard would have a thickness of from 0.100" to 0.140", (or 0.125 to 0.165 for an equivalent thermal capacity) or a reduction of from 33⅓% to 41% (or from 21% to 26% for an equivalent thermal capacity) as compared with prior art ceramic circuitboards.

In many prior art applications when the component layout is particularly dense or there are high power devices mounted on the circuitboard, a heat sink would be required in order to properly dissipate the heat generated by the circuitry.

In order to incorporate a heat sink in prior art ceramic circuit boards, one must metalize the back side of the ceramic substrate, add a solder preform and utilize a reflow furnace to solder the assembly together to a chassis or package. The three aforementioned steps are eliminated with the instant invention because the molybdenum substrate itself can act as a heat sink since its thermal conductivity is so high.

This is also an advantage when a hermetic sealed package is required to afford environmental protection to non-hermetically sealed active circuit elements. In this case the molybdenum substrate serves as the bottom cover of the hermetic package thus eliminating the need for back side substrate metalization, soldering, and the package bottom cover.

Another advantage offered by the instant invention is that there is good thermal coefficient of expansion match between the molybdenum substrate, the thick film layer deposited thereon, and the ceramic chip carriers. The close thermal coefficient of expansion match between the substrate and the ceramic chip carrier limits the magnitude of thermally induced solder joint stresses resulting in improved reliability.

A still further advantage of the utilization of a molybdenum substrate is that it can be fired undamaged in a nitrogen atmosphere furnace to a peak temperature of 900° C. for 6 to 9 minutes. Such a high temperature is required for the DuPont 9950 dielectric and 9923 copper conductor pastes, which are one set of pastes which have been utilized. The copper conductor paste offers the advantage of being more economical than those which are composed of gold.

Figure 2:
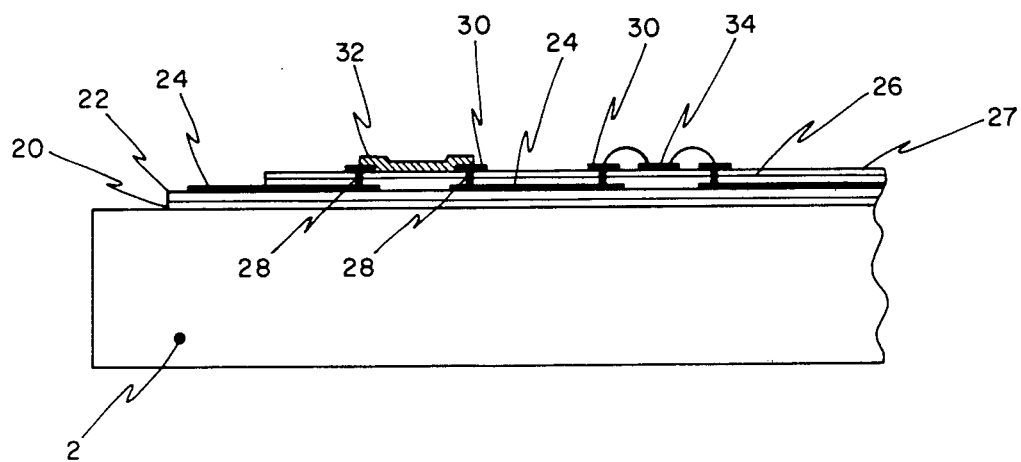
FIG. 2 is a cross sectional view of the molybdenum substrate showing the layers of thick film conductors and dielectrics.

FIG. 2 represents a cross sectional view of the circuit board shown in FIG. 1. The layers of dielectric and conductors are deposited on substrate 2 by standard screening techniques. The first layer of dielectric material 20 is printed, dried, and fired on substrate 2 at the temperatures and for the times and conditions suggested by the manufacturer of the particular dielectric paste material used.

If additional layers of dielectric material 22 are required they can be printed, dried, and fired as was the first layer in order to provide a thicker layer of insulation.

The first layer of conductor material 24 can be printed over dielectric layers 20 and 22 by printing, drying and firing at the temperature and for the times and conditions suggested by the manufacturer of the particular conductor paste material selected.

The next layer of dielectric material 26 would be printed, dried and fired over conductor layer 24. Any vias 28 which may be desired, could also be printed, dried and fired so that electrical continuity may be achieved from conductor layer 24 to another conductor layer such as conductor layer 30. Additional layers such as dielectric layer 27 can be printed, dried and fired over dielectric layer 26. Circuit elements such as resistor 32 can be printed, dried and fired. Chip component 34 can either be soldered or wire bonded to the exposed pads present on the uppermost thick film layer.

While a preferred embodiment of the invention has been shown and described, various other embodiments and modifications thereof will become apparent to persons skilled in the art, and will fall within the scope of invention as defined in the following claims.

Having thus described the invention, what is claimed as new and desired to be secured by Letters Patent of the United States is:

1. A method of making a large area multilayer printed circuit structure comprising:
   a. providing a substrate material made of molybdenum;
   b. screen printing a first layer of dielectric material and allowing said dielectric to dry;
   c. firing said first dielectric layer;
   d. repeating steps b and c until the desired number of dielectric layers have been printed, said dielectric layers having an uppermost dielectric layer with a top surface;
   e. screen printing a first conductor circuit over the top surface of the uppermost dielectric layer and allowing said first conductor to dry;
   f. firing said first conductor, said first conductor having a top surface;
   g. screen printing a second layer of dielectric material over the top surface of said first conductor and the uppermost layer of said first dielectric layers and allowing said second dielectric layer to dry;
   h. firing said second dielectric; and
   i. repeating steps e, f, g and h until the desired number of dielectric-conductor layers have been printed.

2. A method of making a multilayer structure as set forth in claim 1, wherein said repeated steps of screen printing the dielectric involves first printing two layers of dielectric with a patterned screen which patterns many voids in the dielectric so as to create many vias therein, screen printing to fill the vias with conductor material, and then screen printing layers of dielectric before screen printing of the printed circuit conductor layer.

3. The method of fabricating a multilayer structure as set forth in claim 1, wherein components are bonded or soldered to the top surface of the multilayer structure and thus interconnected to at least one exposed conductor.

4. The method of fabricating a multilayer structure as set forth in claim 1, where said drying steps include exposure to air at 125° C. for approximately 15 minutes.

5. The method of fabricating a multilayer structure as set forth in claim 1, where said firing of each of said dielectric layers includes:
   (a) utilizing a continuous belt furnace consisting of a plurality of temperature zones;
   (b) burning out an organic binder in said dielectric at temperatures from 0° to 400° C. in a nitrogen atmosphere of from 0 to 600 parts per million of oxygen;
   (c) firing said dielectric at a peak temperature of from 850° to 925° for 4 to 10 minutes during a total furnace cycle time of 30–60 minutes in nitrogen atmosphere of less than 15 parts per million of oxygen.

6. The method of fabricating a multilayer structure as set forth in claim 1, where said firing of said conductor layer includes:
   (a) utilizing a continuous belt furnace consisting of a plurality of temperature zones;
   (b) burning out an organic binder in said conductor at temperatures from 0° to 400° C. in a nitrogen atmosphere of less than 15 parts per million of oxygen;
   (c) firing said conductor at a peak temperature of from 850°–925° C. for 4 to 10 minutes during a total furnace cycle time of 30–60 minutes in a nitrogen atmosphere of less than 15 parts per million of oxygen.

* * * * *